United States Patent [19]
Covino et al.

[11] Patent Number: 5,715,188
[45] Date of Patent: Feb. 3, 1998

[54] METHOD AND APPARATUS FOR PARALLEL ADDRESSING OF CAMS AND RAMS

[75] Inventors: James J. Covino; Roy Childs Flaker, both of Essex Junction; Alan Lee Roberts, Jericho; Jose Roriz Sousa, Colchester, all of Vt.

[73] Assignee: International Business Machines Corporation, Armonk, N.Y.

[21] Appl. No.: 597,773

[22] Filed: Feb. 7, 1996

Related U.S. Application Data

[63] Continuation-in-part of Ser. No. 398,465, Mar. 3, 1995, Pat. No. 5,563,833.

[51] Int. Cl.⁶ .................................. G11C 13/00
[52] U.S. Cl. .............................. 365/49; 365/201
[58] Field of Search .................. 365/49, 201, 189.05, 365/189.07; 371/21.1, 21.2

[56] References Cited

U.S. PATENT DOCUMENTS

| | | | |
|---|---|---|---|
| 4,646,271 | 2/1987 | Uchiyama | 365/49 |
| 5,099,481 | 3/1992 | Miller | 371/22.1 |
| 5,107,501 | 4/1992 | Zorian | 371/213 |
| 5,138,619 | 8/1992 | Fasang | 371/21.1 |
| 5,224,101 | 6/1993 | Popyack, Jr. | 371/21.2 |
| 5,258,986 | 11/1993 | Zerbe | 371/21.2 |
| 5,311,520 | 5/1994 | Raghavachari | 371/21.6 |
| 5,329,471 | 7/1994 | Swoboda et al. | 364/578 |
| 5,377,148 | 12/1994 | Rajsuman | 371/25.1 |
| 5,396,448 | 3/1995 | Takayanagi | 365/49 |
| 5,448,523 | 9/1995 | Lewis | 365/49 |
| 5,475,825 | 12/1995 | Yonezawa | 365/49 |

*Primary Examiner*—A. Zarahian
*Attorney, Agent, or Firm*—Calfee, Halter & Griswold LLP

[57] ABSTRACT

A method and apparatus are provided for parallel addressing a CAM and a RAM, and also for using a single wordline to address the CAM and/or RAM. The CAM and RAM are addressed using a common wordline, and the common wordline is also used for writing to the CAM during a write cycle and strobing the CAM during a read cycle.

12 Claims, 8 Drawing Sheets

METHOD AND APPARATUS FOR PARALLEL ADDRESSING OF CAMS AND RAMS

RELATED APPLICATIONS

This is a continuation-in-part of U.S. patent application Ser. No. 08/398,465, filed Mar. 3, 1995, now U.S. Pat. No. 5,563,833 entitled "Using One Memory to Supply Addresses to an Associated Memory During Testing" (Atty. Docket No. BU9-95-001).

FIELD OF THE INVENTION

This invention relates generally to a structure and method which allows parallel processing of CAM and RAM memories and which does not require the RAM to wait for the CAM to process the row address for the RAM. In addition, there is a CAM design provided that performs associative or semi-associative decode bit addressing of a RAM and, in more particular aspects, the present invention relates to an improved strobing method and apparatus where the strobing CAMs and RAMs can use the wordline to perform the strobing function.

BACKGROUND ART

The use of CAM and RAM memories in computers for various functions is well known in the art, i.e., those areas used for associative and semi-associative memory addressing. In one configuration, one portion of the address is stored in a CAM memory and the remainder of the address is stored in a RAM memory. The CAM memory does not read out the addresses, but rather compares an address portion generated to the addresses stored in the CAM to see if that portion of the address is stored in the CAM; and, if a match is found, so indicates. The RAM memory used in association with the CAM which contains the remainder of the address reads out the memory stored therein and a comparison is made of the memory read out with the generated address to see if, indeed, there is a comparison made. It is desirable to read the entire address from both the CAM and the RAM as quickly as possible to determine if indeed a generated address is present, and application Ser. No. 08/398,465 gives a technique for providing such a function.

SUMMARY OF THE INVENTION

A method and apparatus are provided for parallel addressing of CAMs and RAMs using a single decoder wordline for addressing both the CAM and the RAM, and also for a technique of using the RAM decoded wordlines to write to the CAM during a write cycle and to provide a strobe signal for the read cycle.

DESCRIPTION OF THE PREFERRED EMBODIMENT(S)

The embodiments described herein utilize a content addressable memory (CAM) and a random access memory (RAM) where the RAM obtains part of its addressing from the CAM, with parallel processing of the CAM and the RAM in a Data Cache Unit (DCU). CAM designs have been classically used in the word dimension as fully associative elements. An address field is compared against a column of CAM cells organized N cells wide and R rows deep. If a match occurs, a wordline associated with the matched row is selected. The selected wordline drives across standard memory cells which contain the desired data. This prior art process creates a situation where the RAM is waiting for the CAM to process its row selection address. In current processor architectures, a key design goal is to design processors that operate at ever faster processing speeds. This design goal holds true for both testing and general operation of the microprocessor architecture.

Figure 1:
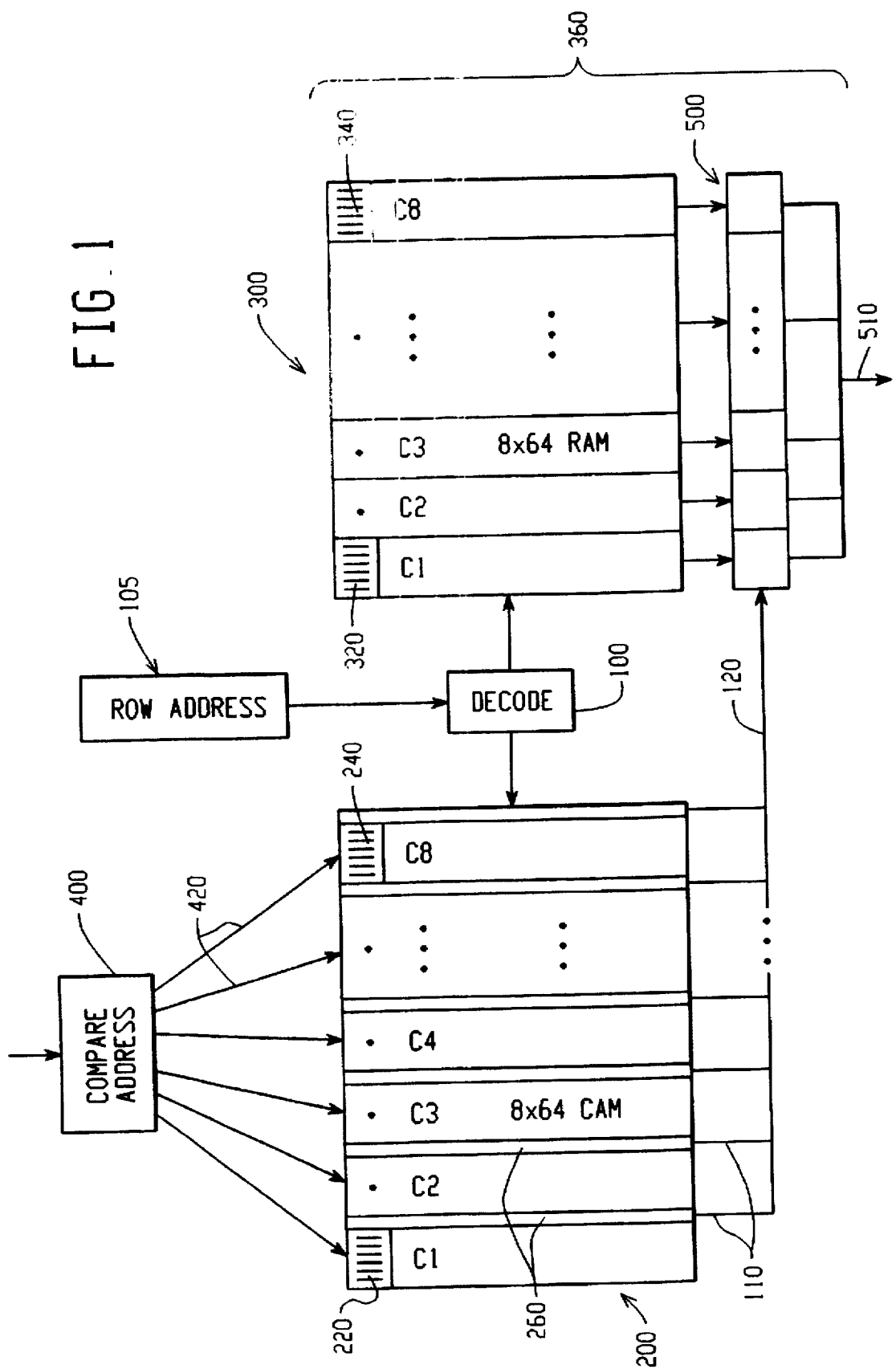
FIG. 1 is a block diagram of the invention showing specific architecture that provides for parallel processing of the CAM and RAM.

In reference to FIG. 1, there is a block diagram showing an architecture that provides parallel processing of a CAM 200 and a RAM 300 which does not require the RAM to wait for the CAM to process the row address for the RAM. In addition, there is a CAM design that performs associative or semi-associative decode bit addressing of a RAM. It is noted that RAM 300 and multiplexor (MUX) 500 can be operated as a TAG, a data storage array architecture, or a DCU, generally indicated by element number 360. In operation, decoder 100 will select which one of 64 rows in the CAM 200 and RAM 300 will be selected when the decoder receives a row address signal 105. (It is to be understood that the CAM and RAM can have a different number of rows than 64. For example, one common configuration is that of 128 rows.) Concerning the operation of the RAM 300, the selected RAM row will download all data stored in the selected data locations onto the associated eight RAM columns, referred to as C1–C8. For example, data locations 320 through 340 would be downloaded to C1 through C8, respectively. The RAM data will thereby be routed to MUX 500, illustrated as an 8×1 MUX, where one of the eight inputs from the RAM will be enabled to immediately route one of the columns of RAM data to output line 510. Concerning the operation of the CAM 200, a row address 105 signal arrives at the decode 100, and a compare address 400 is simultaneously routed, via lines 420, to every CAM location (i.e., locations 220 to 240) on every CAM row. If there is a match on the selected row, then a cascaded OR 260 (one per column C1 to C8) will pull the associated CAM column output line 110 high. The output lines 110, which form a bus 120, are each coupled to MUX 500. In operation, for example, CAM column C1 can output a signal to output line 110 that will program MUX 500 to allow data in RAM column C1 to be output to output line 510. In summary, by using a row decode circuit 100 to simultaneously select the row of the RAM and CAM, and by using bit addressing of the CAM, the MUX 500 can be enabled before the data in the selected row of the RAM arrives. Therefore, the RAM processing will not have to wait for the CAM processing to first be completed.

Figure 2:
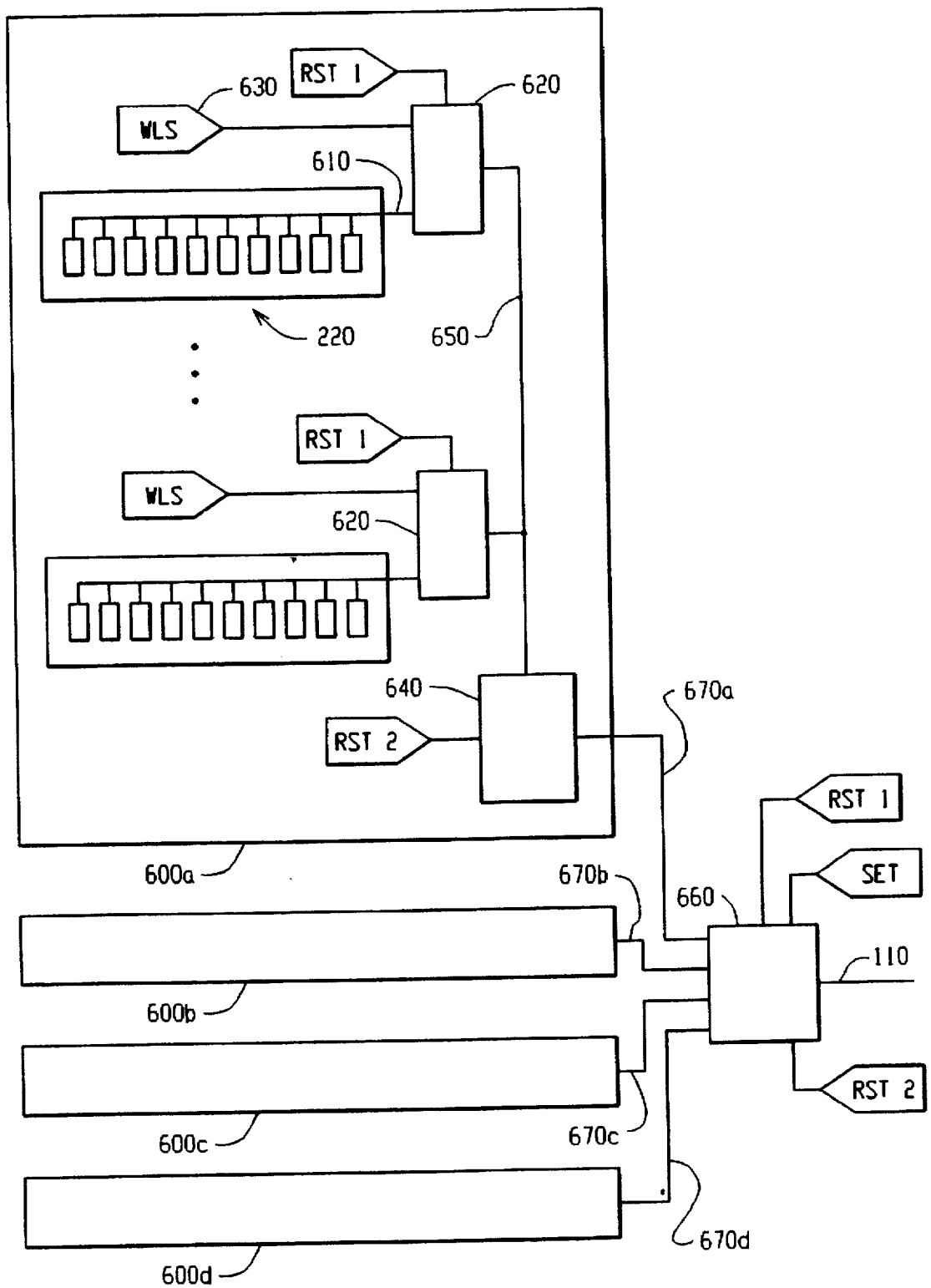
FIG. 2 is a block diagram of the invention showing the circuitry of a single CAM column and associated cascaded.

In reference to FIG. 2, there is shown a block diagram of the specific circuitry for a single CAM column and associated cascaded OR. The column of CAM locations and associated OR is divided into four equal blocks 600a–600d each having equal numbers of rows or address locations, i.e., location 220. In this example for illustration purposes, there are ten bit cells in each CAM location. When the location receives the compare address, the results will either cause match line 610 to be a high or low voltage level. For example, when the compare address 400 matches the location 220, the cascaded OR coupled to the first CAM column C1 will be activated to output a high signal on the matching column output line 110. More particularly, the sequence of events are as follows: match line 610 outputs a high voltage, wordline select (WLS) 630 strobes, first cascaded OR circuit 620 will pull line 650 low, the second cascaded OR circuit 640 outputs a high voltage on line 670a, and the third cascaded OR circuit 660 will output a high voltage signal on the associated output line 110. It should be noted that WLS 630 is the input from the decode circuit 100. It should be further noted that the decode circuitry 100 includes the wordline driving circuitry (not shown here).

Figure 3:
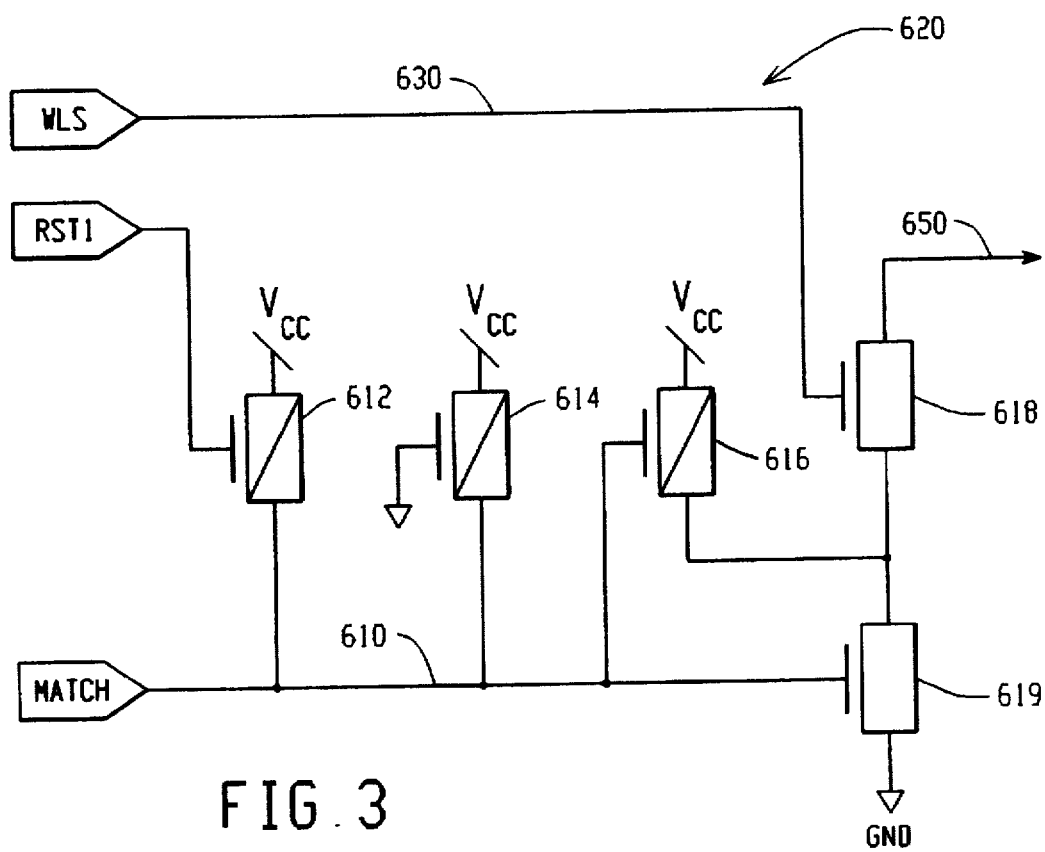
FIG. 3 is a circuit diagram of the invention showing a specific first cascaded OR circuit that is associated with every CAM address location.

In reference to FIG. 3, there is a circuit diagram of the first cascaded OR circuit 620 that is coupled to every CAM address location. In operation, if a match occurs between the compare address and the CAM location, match line 610 will remain high, via PFET 614, and NFET 619 will remain activated. Output line 650 will then be brought low after WLS 630 strobes. If there is no match, the following sequence occurs: match line 610 is brought low, NFET 619 will be turned off, so that when WLS strobes, NFET 618 will be activated, and output line 650 is maintained high. Whether there is a match or not, circuit 620 needs to be reset to the starting conditions. The starting conditions are reset after WLS strobes, by strobing reset RST1, causing PFET 612 to pull line 610 high with the assistance of PFET 614 so that output line 650 will be maintained high. It is pointed out that PFET 616 operates to reduce noise and prevent NFET 619 from turning on when there is no match. It is also noted that when WLS 630 strobes, it strobes across the entire eight columns in the CAM.

Figure 4:
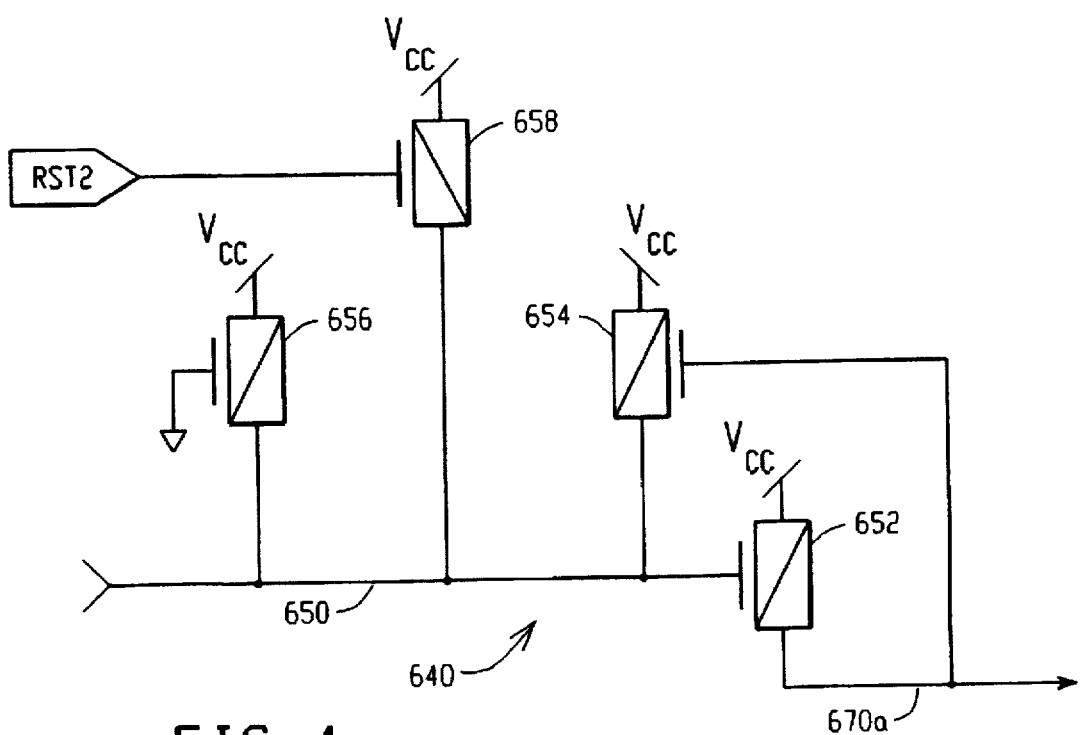
FIG. 4 is a circuit diagram of the invention showing a specific second circuit in the cascaded OR that receives output signals from the first cascaded OR circuit shown in FIG. 3.

Referring now to FIG. 4, there is a specific circuit diagram of a second circuit 640 in the cascaded OR. In operation, when output line 650 remains high, via PFET 656, PFET 652 remains deactivated; preventing output line 670a from being pulled high. When output line 650 is pulled low by activating NFETs 618 and 619, PFETs 656 and 654 are overpowered, and output line 670a is driven high turning off PFET 654. To rest circuit 650 to the initial conditions, reset signal RST2 strobes causing PFET 658 to pull output line 650 high with the assistance of PFET 656. It is noted that PFET 654 is used to reduce noise effects and prevents PFET 652 from accidentally turning on by assisting in pulling line 650 high.

Figure 5A:
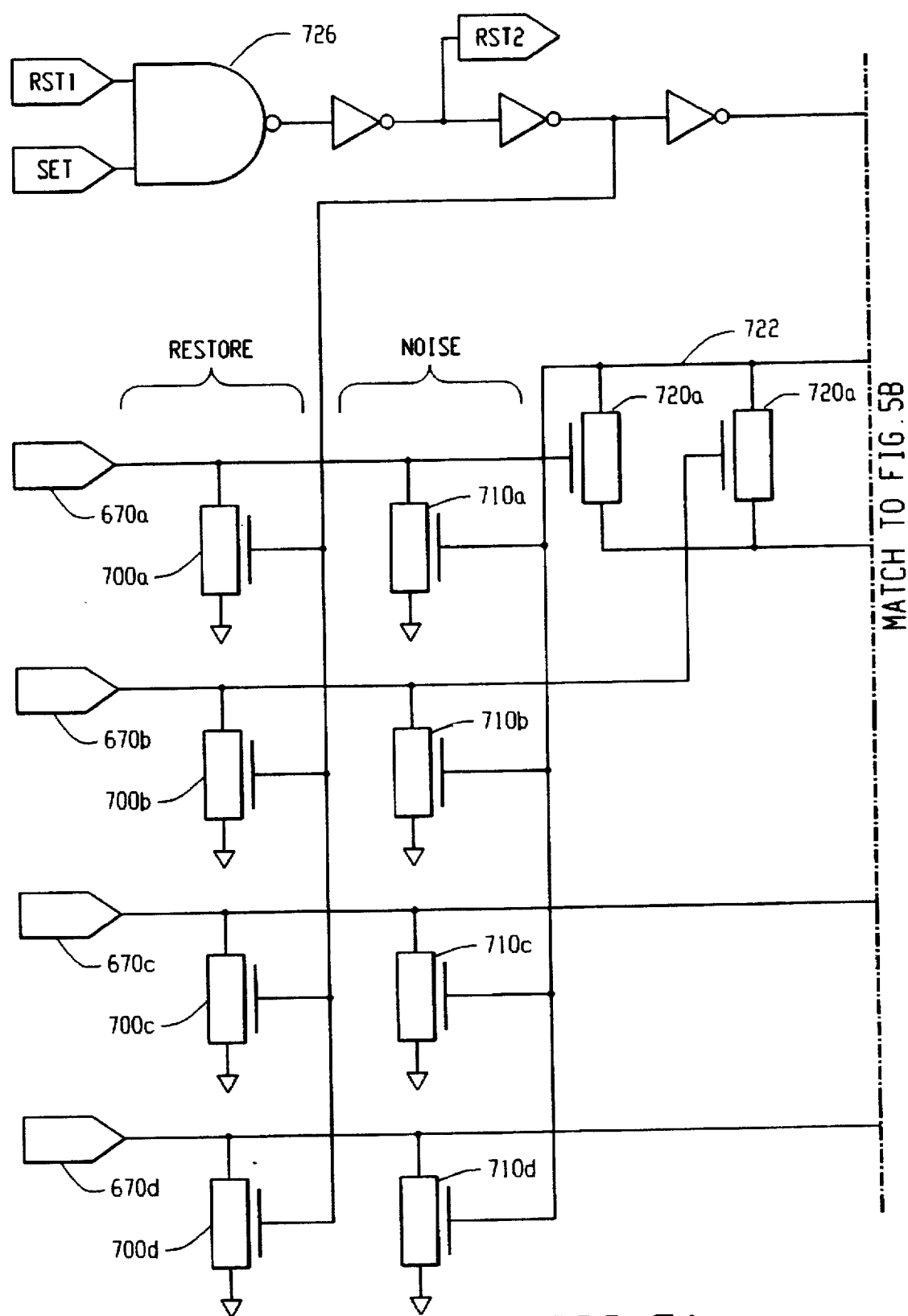
FIGS. 5a and 5b illustrate a circuit diagram of the invention showing a third circuit in the cascaded OR that receives output signals from the second circuit of the cascaded OR shown in FIG. 4.
Figure 5B:
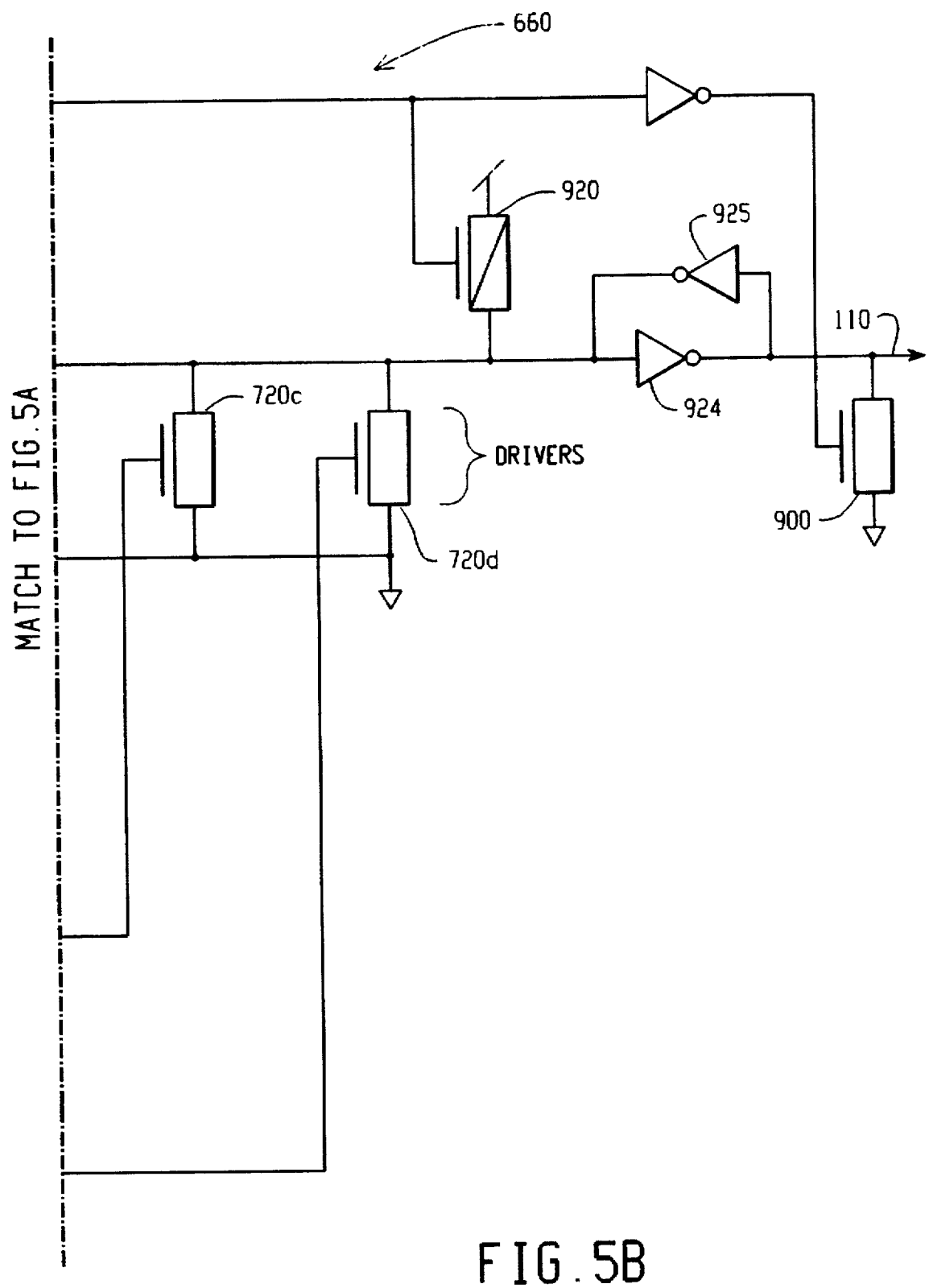

Referring now to FIGS. 5a and 5b, there is a circuit diagram of a third circuit 660 in the cascaded OR. In operation, when any of the output lines 670a–670d are brought high, a related NFET 720a–720d will drive node 722 low, which will drive output line 110 high via inverter 924. In contrast, when output lines 670a–670d all remain low, node 722 remains high, thus leaving output 110 low. It is noted that PFETs 710a–710d are used to reduce noise effects and prevent accidental turning on of the driving NFETs 720a–720d. To reset circuit 660, NAND gate 726 is activated by only strobing reset RST1, because SET is always maintained high after the initial start up of the integrated circuit. As a result, RST2 is driven low, and NFETs 700a–700d are activated to restore all output lines 670a–670d to a low voltage level. Additionally, PFET 920 will pull node 722 high, thus driving output line 110 low with the assistance of NFET 900 and inverter 924. It is noted that the SET signal is pulsed when the chip is powered up to initiate the cascaded OR for operation.

It is noted that there are many variations that one skilled in the art may employ in practicing the bit decoding of the RAM. In particular, the CAM columns may be divided into any number of parts and not just the four as illustrated. The re-partitioning of the CAM would then require a reconfiguration of the cascaded OR circuitry to provide for more levels or stages. Similarly, one skilled in the art would easily conceive of other logic devices other than the cascaded OR as illustrated.

Figure 6:
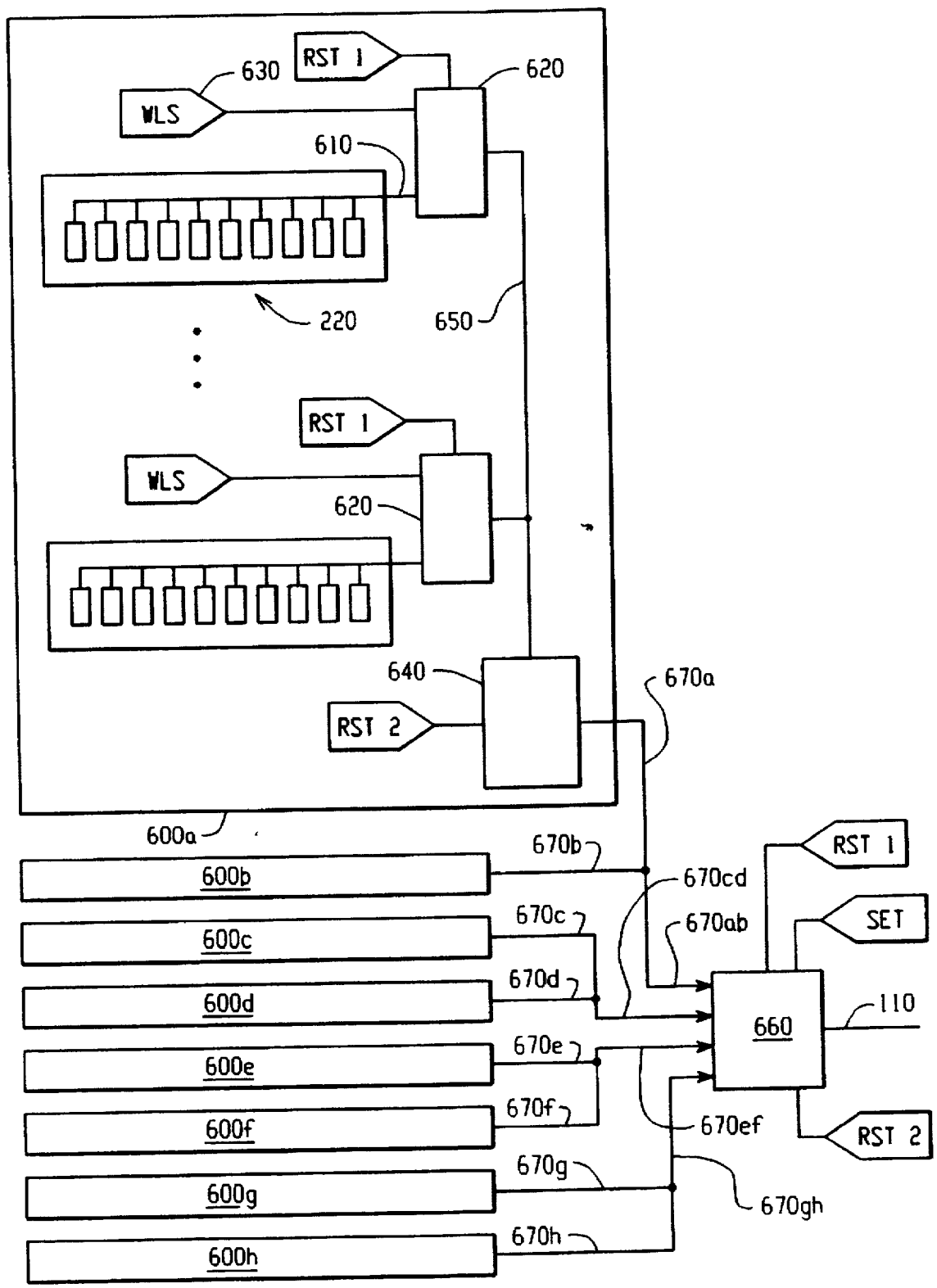
FIG. 6 is a block diagram similar to FIG. 5 showing a different action of the circuitry of a single CAM column and associated cascaded OR with ORed connections.

Referring now to FIG. 6, a circuit is illustrated which is a slight modification of that shown in FIG. 2 depicting how additional rows of CAM locations and associated OR can be connected in a "cascaded OR" configuration to accommodate the additional blocks which have an equal number of rows or address locations. In this figure, eight equal blocks 600a–600h are employed, blocks 600a and 600b have their lines 670a and 670b dot ORed and connected to provide lines 670a–b to the cascaded OR circuit 660. Similarly, blocks 600c and 600d have their lines 670c and 670d connected in a dot ORed configuration to provide line 670c–d to the cascaded OR circuit 660; blocks 600e and 600f have lines 670e and 670f connected to form line 670e–f; and blocks 600g and 600h have line 670g and 670h respectively connected to form line 670g–h; both lines 670e–f and 670g–h being connected to the cascaded OR circuit 660. This will provide a cascaded OR response if there is a signal on either of the paired together lines, i.e., if there is a signal on either the line 670a or 670b, it will be asserted on 670a–b; if there is a signal on either 670c or 670d, it will be asserted on line 670c–d; if there is a signal on line 670e or 670f, it will be asserted on line 670e–f; and if there is a signal on either line 670g or 670h, it will be asserted on line 670g–h.

Figure 7:
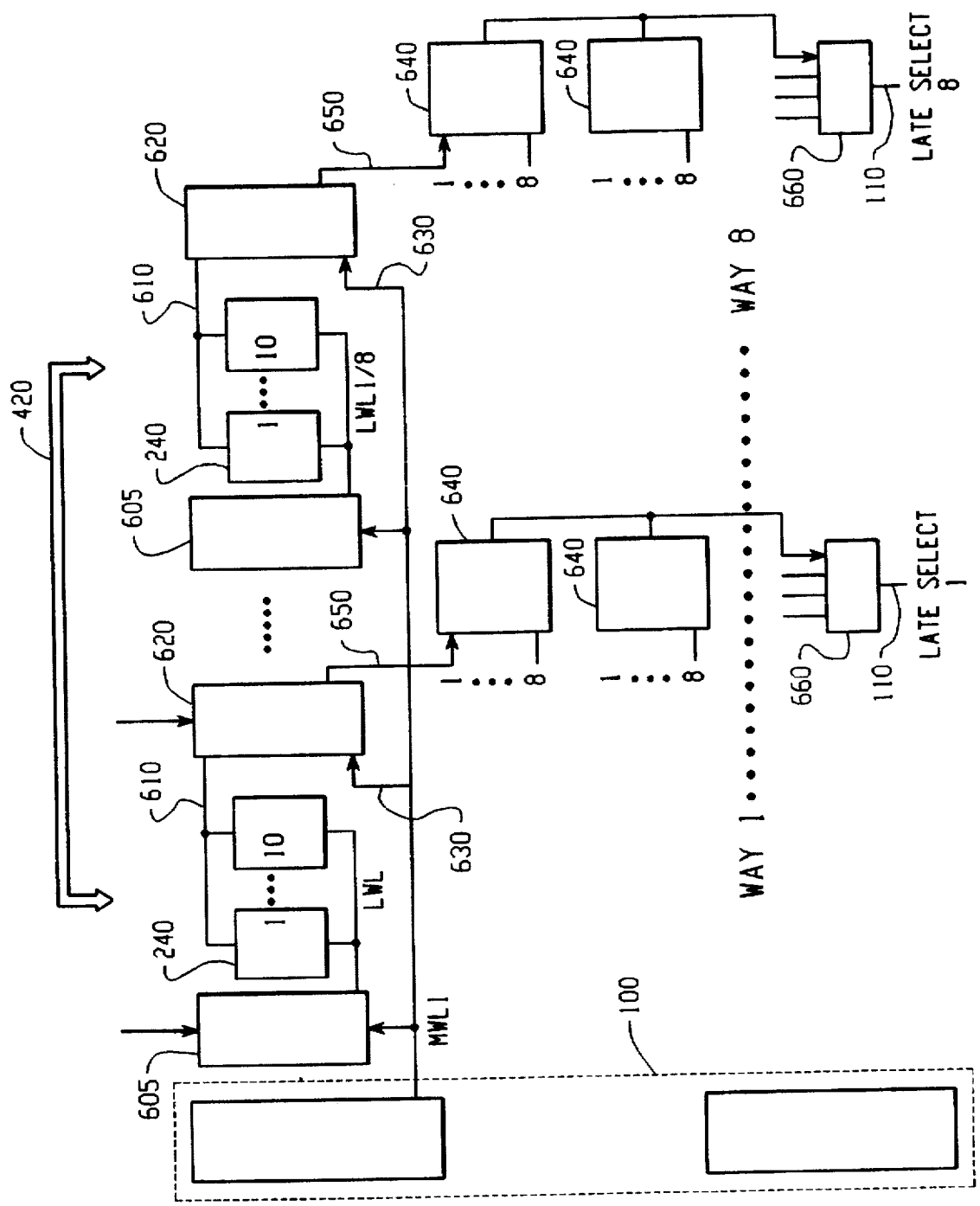
FIG. 7 is a diagram of the strobing circuit for the CAM.

FIG. 7 shows a partial CAM diagram with one wordline, and two out of the eight ways wherein the decoded wordline is used to write the CAM 200 (FIG. 1) and also is the decoded strobe signal used during the cycle in which the CAM is compared. Decode circuit 100 generates a master wordline MWL1 which feeds local wordline divers 605, and the compare strobe circuit 620. During a write cycle, the local wordline driver 605 drives high a local wordline LWL, allowing the ten CAM cells 240 to be written with the compare addresses 420.

During a read cycle, the contents of the CAM cells are compared against compare addresses 420. If a match occurs, line 610 is driven high. If the line 610 that is driven high is located at the same CAM wordline selected by decoder 100, then the compare strobe circuit 620 drives line 650 low to drive cascaded OR circuits 640 and 660 as described in FIGS. 2 through 6.

Therefore, the master wordline is used, not only to select cells to be written, but also as a decoded strobe signal which samples line 610 in circuit 620. This way, the CAM evaluates if a match did or did not occur at any of its eight ways.

Figure 8:
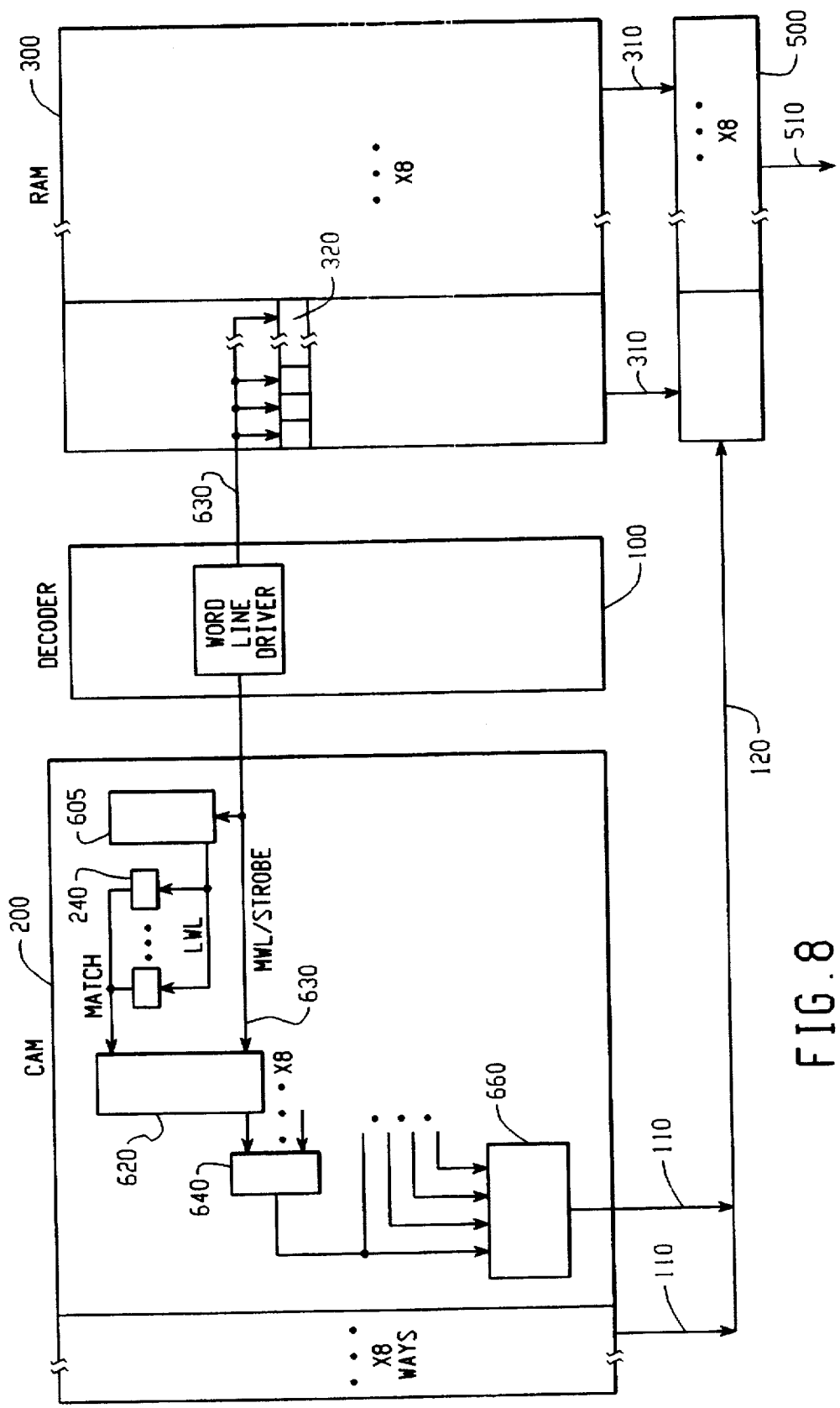
FIG. 8 is a diagram of the strobing circuit for both a CAM and RAM memory.

Referring now to FIG. 8, a diagram of one wordline of decoder 100, CAM 200 and RAM 300 is shown. A common decoder 100 is used for both CAM and RAM which provides a master wordline shown and described in FIG. 7 to both the CAM and the RAM. During a read cycle, the decoded wordline 630 strobes the eight ways in the same CAM wordline. If a match occurs in the CAM, the appropriate cascaded OR is activated as described in FIGS. 2 through 6. Simultaneously, on the RAM side, the data is read out of the cells propagating towards Mux 500. Since the decoder 100 is physically located between a CAM and a RAM, good tracking exists between the two arrays because both are accessed at the same instant. Additionally, both arrays propagate data through diffusion dominated networks with similar traveling distances from the cells to the output. This tracking allows good synchronization between the mux selection signals 120 and data 310 read from the RAM.

Accordingly, the preferred embodiment of the invention will provide for parallel processing of the CAM and the RAM. Since the CAM processing is faster, the RAM data is immediately output upon reaching the MUX circuitry. With the foregoing description in mind, however, it is understood that this description is made only by way of example. Additionally, the invention is not limited to the particular embodiments described herein. Moreover, it is noted that there are various rearrangements, modifications, and substitutions that may be implemented without departing from the true spirit of the invention as hereinafter claimed.

What is claimed:

1. An integrated circuit, comprising:
   a) a RAM having at least two data columns containing data therein;
   b) gating circuitry coupled to the first and second RAM columns for gating the output of RAM data; and
   c) a CAM having:
      c1) at least two address columns having a plurality of address locations therein; and
      c2) control circuitry coupled to each address location in the first and second address column located in the CAM and coupled to the gating means, for sending a control signal to the gating means when a compare address matches an address in either the first or second address column thereby outputting the RAM data from the data column that is addressed through the gating means.

2. The integrated circuit of claim 1 wherein the control circuitry comprises a first and second cascaded OR coupled to each address location in the first and second address column, respectively.

3. The integrated circuit of claim 2, wherein the gating circuitry comprises a MUX.

4. The integrated circuit of claim 2, further comprising a decode circuit for determining which row of the RAM and CAM will be addressed.

5. The integrated circuit of claim 1 wherein said CAM has at least two rows of data "OR" together.

6. The integrated circuit of claim 1 wherein said CAM has a wordline elect operated by said OR circuit.

7. The integrated circuit as defined in claim 6 wherein said RAM has a wordline selected in common with said CAM.

8. The circuit as defined in claim 1, wherein said circuit includes a decoder to decode a row address signal.

9. The circuit as defined in claim 8, wherein said decoder is physically located between said RAM and said CAM.

10. A method of outputting data from a RAM through a gating circuitry that is activated by a CAM, wherein the method comprises the following steps;
    a) addressing a row in both the RAM and CAM;
    b) sending a compare address to each column in the CAM;
    c) comparing each CAM location in the addressed row to the compare address;
    d) outputting a control signal from the CAM column that contains a match to the compare address;
    e) outputting all data from the selected row in the RAM to a gating device; and
    f) receiving the control signal at the gating device at about the same time the gating device receives the RAM data, to prevent all but one column of the addressed RAM row of data from being output from the gating device.

11. A method of addressing a content addressable memory (CAM) which can be written to during a write cycle and compared during a RAM read cycle, including the steps of providing a decoded wordline to write to the CAM, and using the same decoded wordline to provide a strobe signal for comparing each CAM location in an addressed row to a compare address and reading said RAM.

12. The method of claim 11 wherein said method includes writing and reading to and from a random access memory (RAM), and wherein said decoded wordline provides the read and write signal to the RAM and the strobe signal during the compare of the CAM.

* * * * *